US011101198B2

(12) United States Patent
Im et al.

(10) Patent No.: US 11,101,198 B2
(45) Date of Patent: Aug. 24, 2021

(54) SEMICONDUCTOR DIE PACKAGE INCLUDING A ONE-BODY CLIP

(71) Applicant: SEMICONDUCTOR COMPONENTS INDUSTRIES, LLC, Phoenix, AZ (US)

(72) Inventors: Seungwon Im, Bucheon-si (KR); Joonseo Son, Seoul (KR); Oseob Jeon, Seoul (KR)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/804,662

(22) Filed: Feb. 28, 2020

(65) Prior Publication Data

US 2020/0194346 A1 Jun. 18, 2020

Related U.S. Application Data

(63) Continuation of application No. 15/729,973, filed on Oct. 11, 2017, now Pat. No. 10,586,754.
(Continued)

(51) Int. Cl.
*H01L 23/495* (2006.01)
*H01L 23/38* (2006.01)
(Continued)

(52) U.S. Cl.
CPC .... *H01L 23/49517* (2013.01); *H01L 23/3107* (2013.01); *H01L 23/3121* (2013.01); *H01L 23/3735* (2013.01); *H01L 23/38* (2013.01); *H01L 23/4093* (2013.01); *H01L 23/4334* (2013.01); *H01L 23/49524* (2013.01); *H01L 23/49562* (2013.01); *H01L 23/49575* (2013.01); *H01L 2224/0603* (2013.01);
(Continued)

(58) Field of Classification Search
CPC ..... H01L 2924/181; H01L 2924/00012; H01L 2224/40245; H01L 2224/48247; H01L 2225/06513; H01L 23/3107; H01L 23/3121; H01L 23/3735; H01L 23/38; H01L 23/4093; H01L 23/4334; H01L 23/49517; H01L 23/49524; H01L 23/49562; H01L 23/49575
See application file for complete search history.

(56) References Cited

U.S. PATENT DOCUMENTS 7,456,492 B2   11/2008 Mochida
9,130,065 B2    9/2015 Im et al.
(Continued)

OTHER PUBLICATIONS

Tetsuya Ueda et al., "Simple, Compact, Robust and High-performance Power module T-PM (Transfer-molded Power Module)," Power Device Works, Mitsubushi Electric Corp., Jun. 6-10, 2010.

*Primary Examiner* — Robert G Bachner
(74) *Attorney, Agent, or Firm* — Brake Hughes Bellermann LLP

(57) ABSTRACT

In one general aspect, an apparatus can include a semiconductor die, a substrate, and a leadframe coupled to the substrate and defining an opening. The apparatus can include a one-body clip having a first portion disposed within the opening and coupled to the semiconductor die. The one-body clip can have a second portion disposed within the same opening and coupled to the substrate.

21 Claims, 12 Drawing Sheets

Related U.S. Application Data

(60) Provisional application No. 62/415,939, filed on Nov. 1, 2016.

(51) Int. Cl.
*H01L 23/433* (2006.01)
*H01L 23/373* (2006.01)
*H01L 23/40* (2006.01)
*H01L 23/31* (2006.01)

(52) U.S. Cl.
CPC ............... *H01L 2224/40245* (2013.01); *H01L 2224/48247* (2013.01); *H01L 2225/06513* (2013.01); *H01L 2924/00014* (2013.01); *H01L 2924/1033* (2013.01); *H01L 2924/10253* (2013.01); *H01L 2924/10272* (2013.01); *H01L 2924/1305* (2013.01); *H01L 2924/13055* (2013.01); *H01L 2924/13091* (2013.01); *H01L 2924/1433* (2013.01); *H01L 2924/181* (2013.01)

(56) References Cited

U.S. PATENT DOCUMENTS

| | | | |
|---|---|---|---|
| 2008/0105957 A1* | 5/2008 | Joshi | H01L 24/37 257/666 |
| 2009/0174044 A1* | 7/2009 | Eom | H01L 21/56 257/675 |
| 2014/0035658 A1 | 2/2014 | Usui | |
| 2014/0273349 A1 | 9/2014 | Lim et al. | |
| 2014/0327144 A1* | 11/2014 | Yang | H01L 23/50 257/762 |
| 2015/0103498 A1 | 4/2015 | Lee et al. | |
| 2016/0336256 A1 | 11/2016 | Shibuya et al. | |
| 2017/0207306 A1 | 7/2017 | Otremba et al. | |
| 2017/0365583 A1 | 12/2017 | Im et al. | |

\* cited by examiner

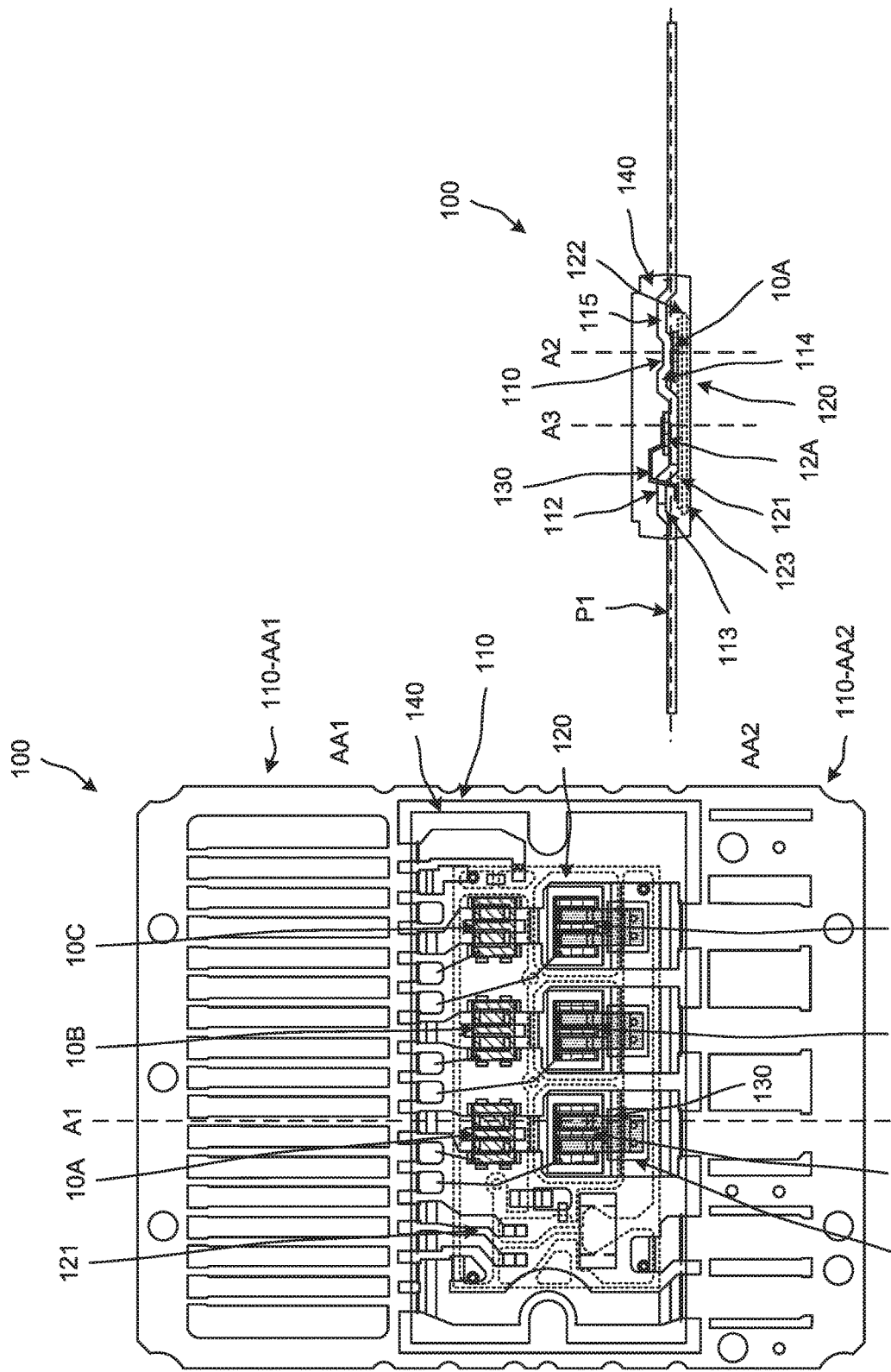

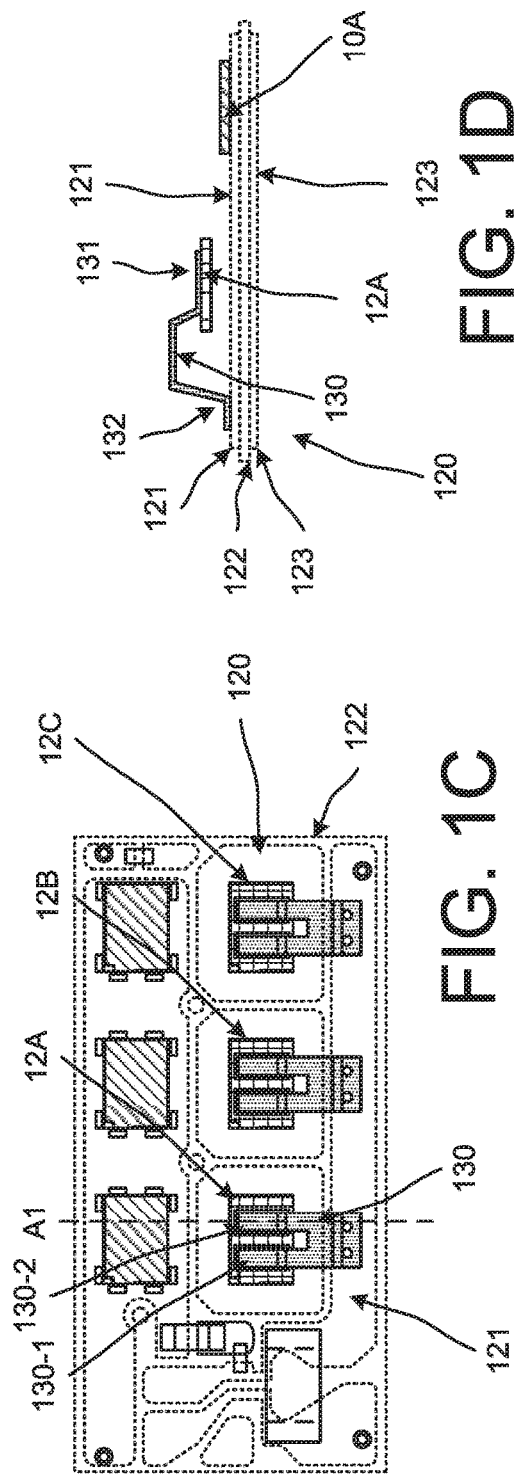
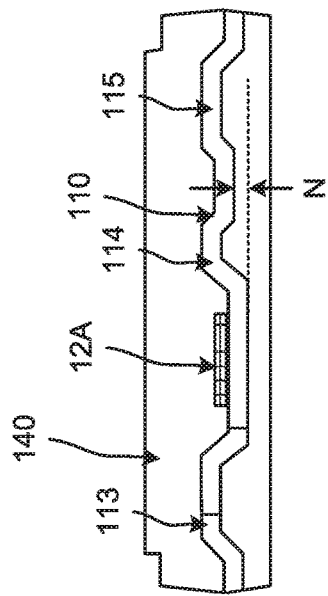
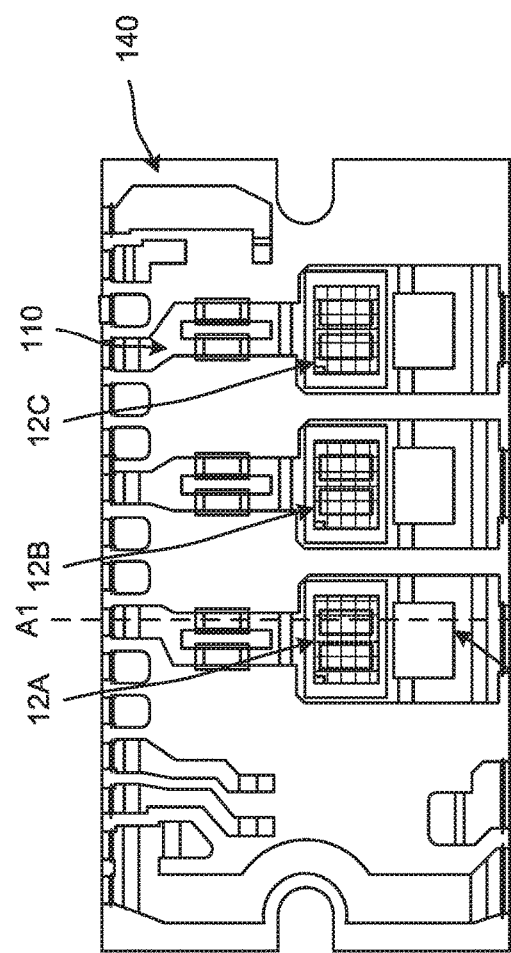
FIG. 1C
FIG. 1D
FIG. 1E
FIG. 1F

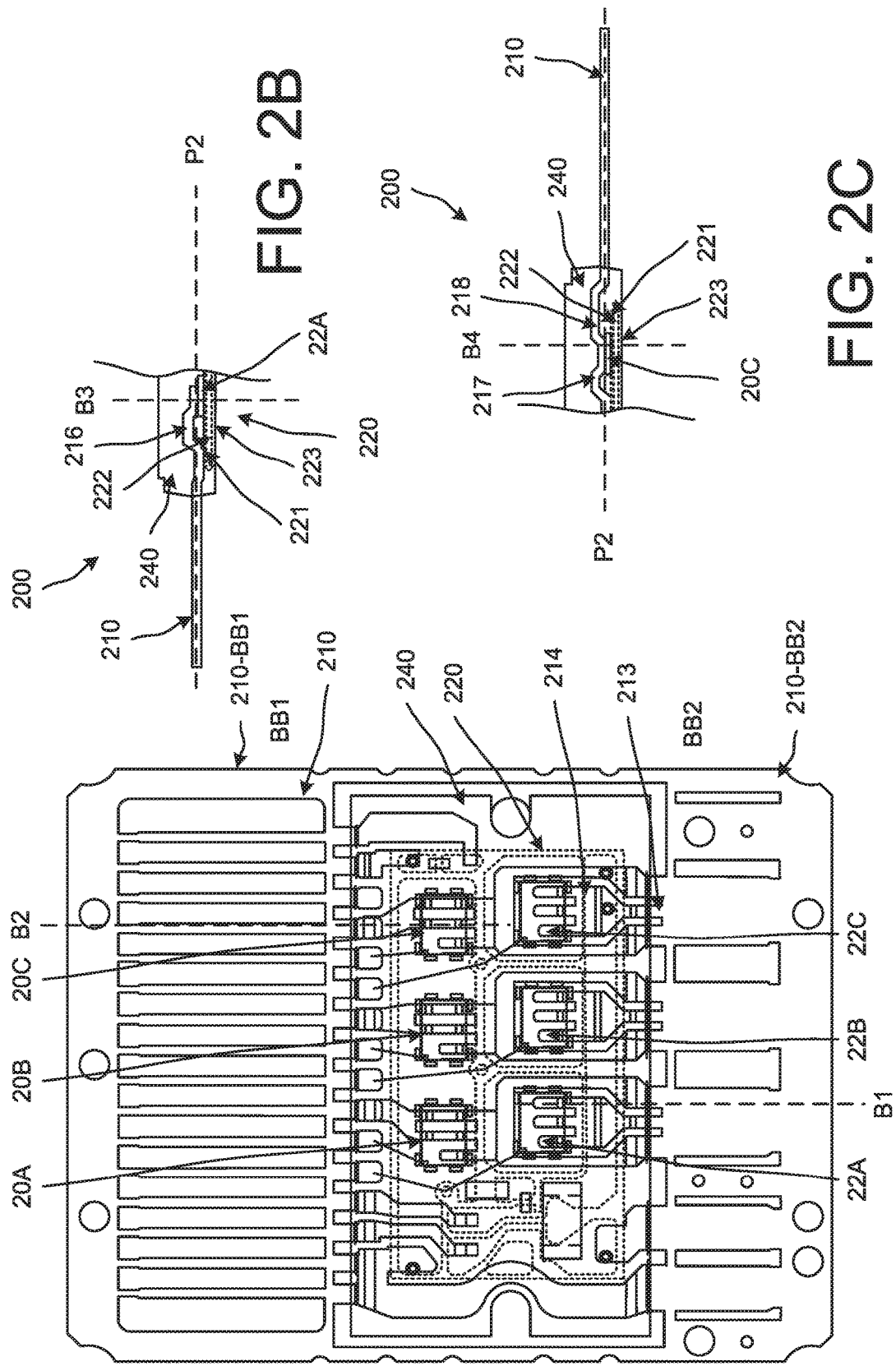

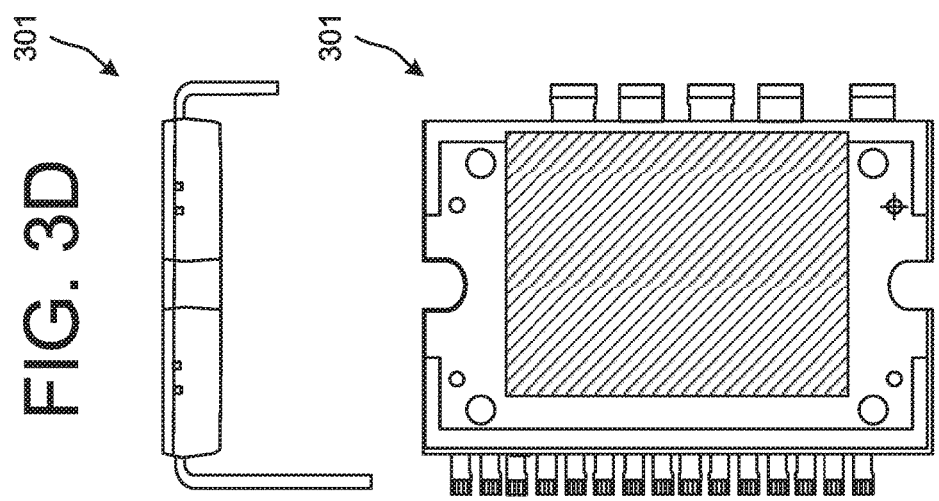
FIG. 3D    FIG. 3E
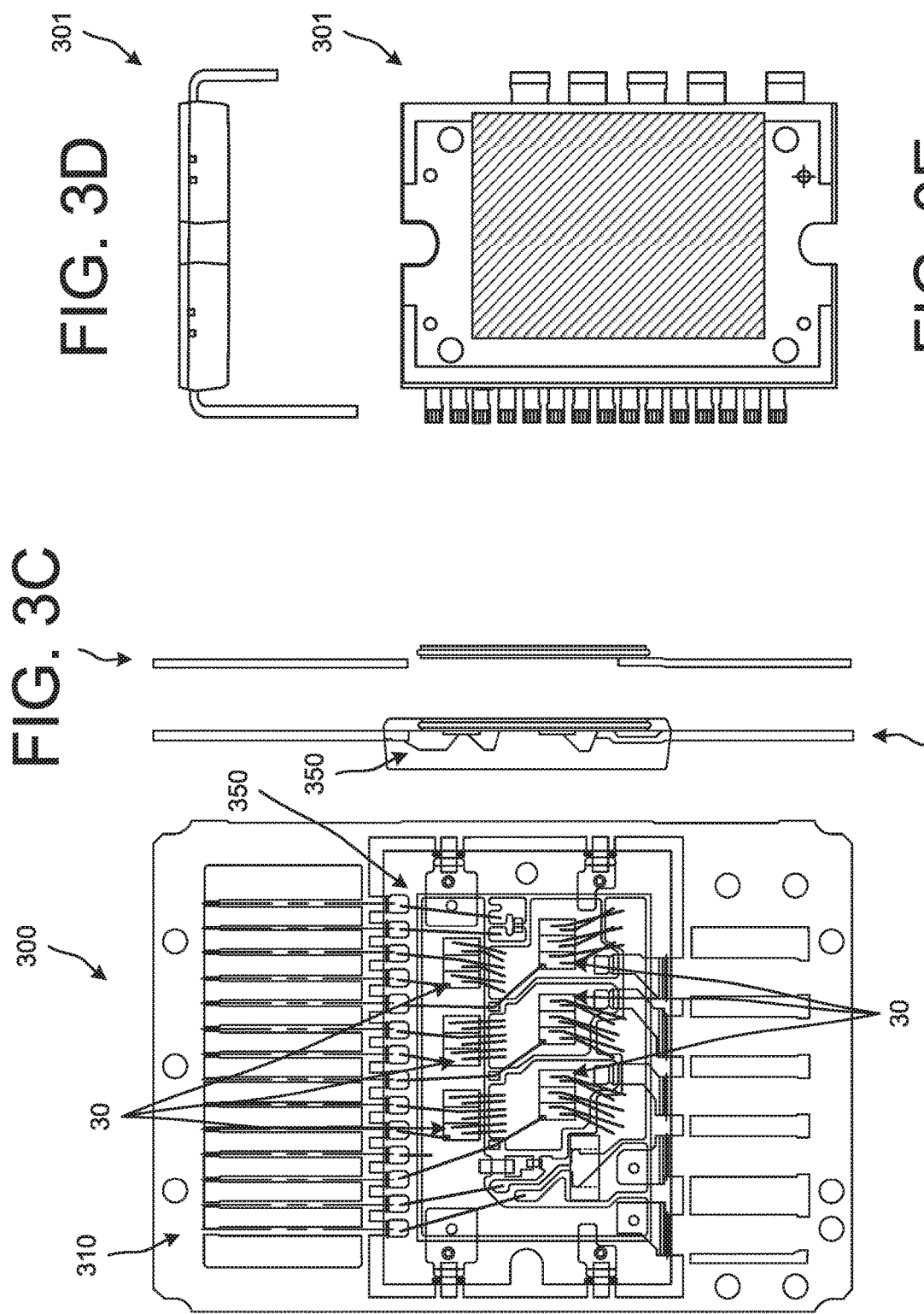
FIG. 3C
FIG. 3A    FIG. 3B

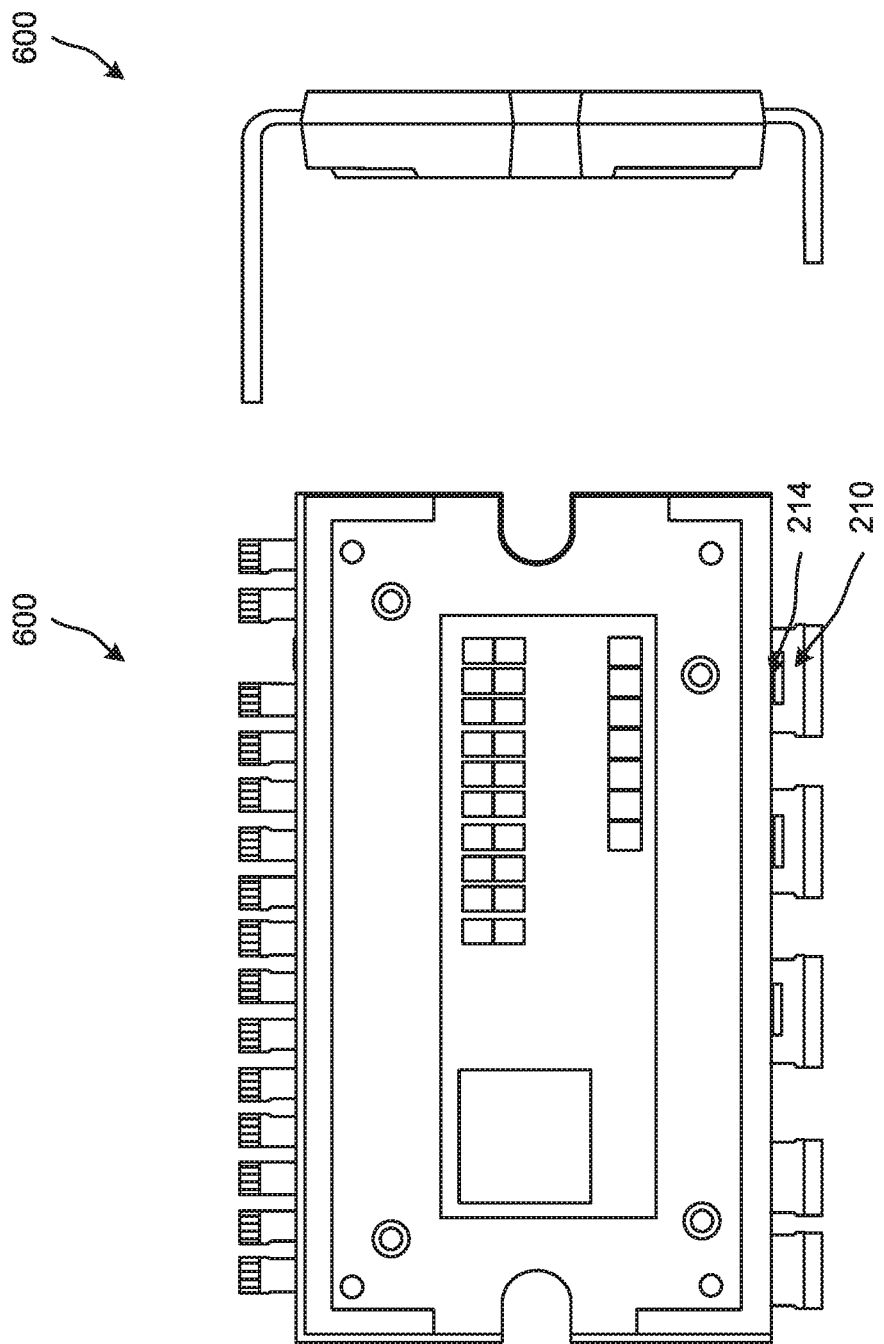

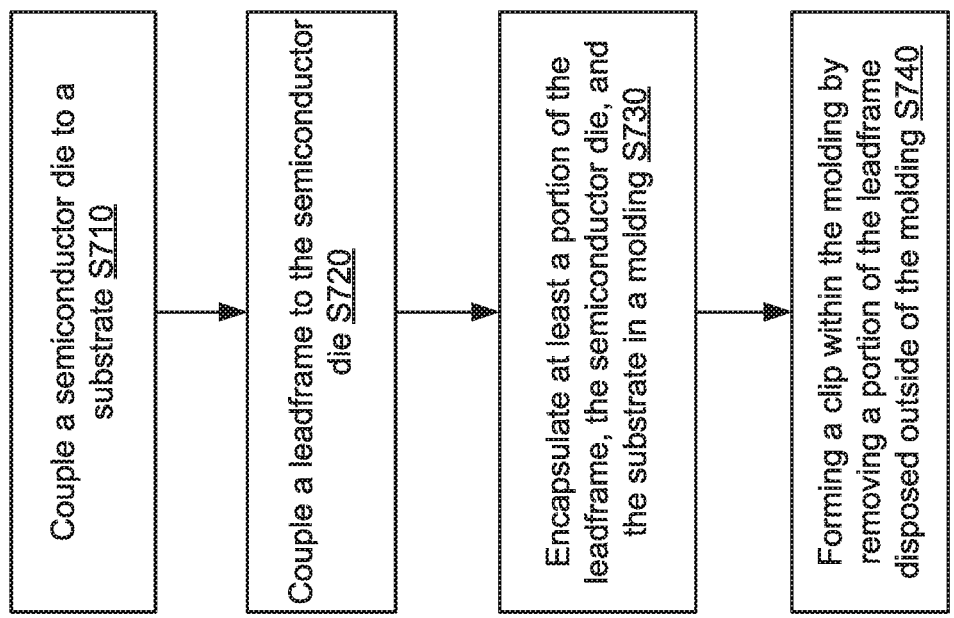

SEMICONDUCTOR DIE PACKAGE INCLUDING A ONE-BODY CLIP

RELATED APPLICATIONS

This application is a continuation of U.S. Non-Provisional application Ser. No. 15/729,973, filed on Oct. 11, 2017, which claims priority to and the benefit of U.S. Provisional Patent Application No. 62/415,939, filed on Nov. 1, 2016, both of which are incorporated herein by reference in their entireties.

TECHNICAL FIELD

This description relates to a semiconductor die package and manufacturing method.

BACKGROUND

As the world of electronics moves towards smaller sizes, higher efficiency, and lower cost, integration techniques are in great demand for making smaller, more intelligent and more efficient products, in a variety of spaces including the power management space. The highest performance devices, such as power devices, are often manufactured discretely as opposed to being integrated in an integrated circuit (IC) process. The cost of producing such discrete devices can be a fraction of those produced using such complex processes because the mask layers used in discrete devices are generally a fraction (e.g., one half, one third) of the number of those used in more complex IC processes. Many known approaches have used, for example, leadframe packages and copper clips to achieve integration, but the shortcomings of such packages have been higher cost, inferior thermal performance, higher inductance, larger size and generally a lower level of integration. Thus, a need exists for systems, methods, and apparatus to address the shortfalls of present technology and to provide other new and innovative features.

SUMMARY

In a general aspect, an apparatus can include a semiconductor die, a substrate, and a leadframe coupled to the substrate. The apparatus can include a conductive clip coupled to the semiconductor die. The leadframe can be disposed between the semiconductor die and the substrate, and the semiconductor die can be disposed between the conductive clip and the leadframe.

BRIEF DESCRIPTION OF THE DRAWINGS

FIGS. 1A through 1H are diagrams that illustrate components included within a package.

FIGS. 2A through 2J are diagrams that illustrate additional components included within a package.

FIGS. 3A through 3C illustrate various view of components of a package.

FIGS. 3D and 3E illustrate various view of the package referenced in FIGS. 3A through 3C.

FIGS. 6A and 6B illustrate various view of a package of the components of the package shown in FIGS. 2A through 2J.

FIG. 7 is a method that illustrates a method of making a package including a semiconductor die.

DETAILED DESCRIPTION

Figure 1G:
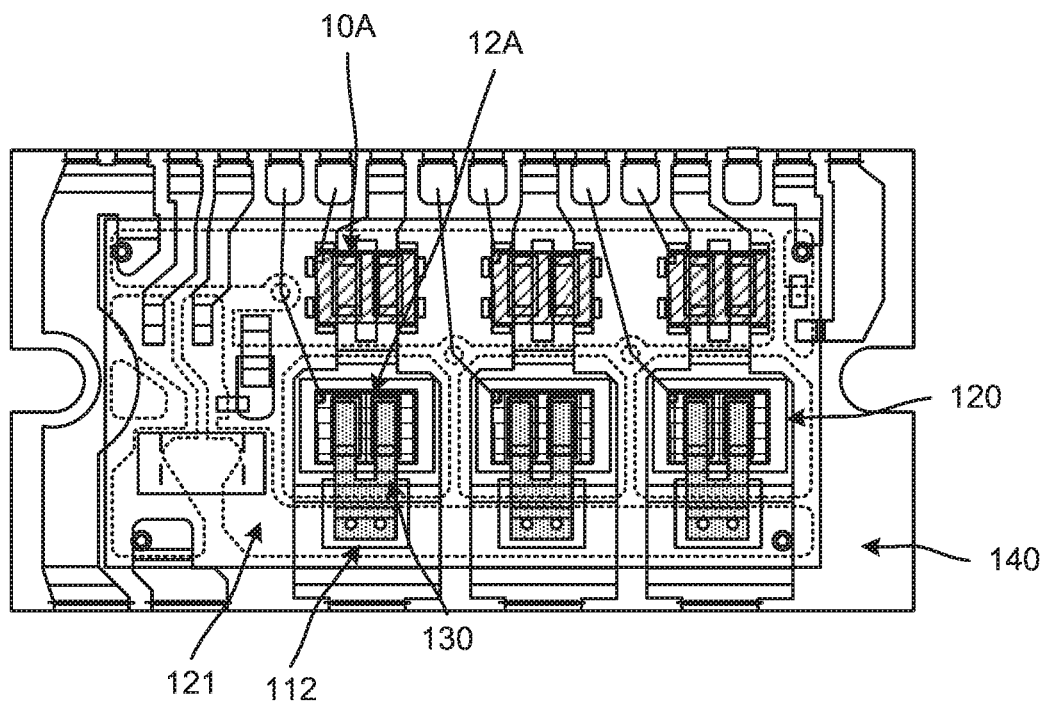

The packages described herein include various vertical combinations (or stacks) of substrates (e.g., direct bonded metal (e.g., copper) substrates), semiconductor die, leadframes (e.g., extended leadframes), and clips. These vertical combinations can result in multi-chip module (MCM) packaging that has not only relatively low resistance, but also has high current capability. In some implementations, semiconductor die may be coupled to both a top and a bottom of a leadframe. In some implementations, a clip (e.g., a one-body clip) can be used to achieve a relatively low resistance and/or low inductance.

FIG. 1A is a plan (or top) view diagram that illustrates components 100 included within a package. The components 100 of the package include several semiconductor die 10A, 10B, 10C, 12A, 12B, and 12C (which can be referred to as die), a leadframe 110 (e.g., a stamped leadframe 110), and a substrate 120 (which can be a directed bonded metal substrate (e.g., a directed bonded copper (DBC) substrate)). In this implementation, the substrate 120 (shown with dashed lines to make it easier to view the pattern) is disposed below the leadframe 110. In other words, the leadframe 110 is disposed on top of the substrate 120.

The substrate 120 can be, or can include, a direct bonded copper substrate that can include a stack including a dielectric (e.g., dielectric 122 shown in FIG. 1B) disposed between a first metal layer (e.g., metal layer 121 shown in FIG. 1B, a top metal layer) and a second metal layer (e.g., metal layer 123 shown in FIG. 1B, a bottom metal layer). In some implementations, the components 100 of the package, when in final module form (shown as, for example, package 400 in FIGS. 4A and 4B), can be referred to as a multi-chip module (MCM) or can be referred to as a semiconductor die package.

In some implementations, the semiconductor die 10A through 10C can each be relatively high-voltage (HV) devices (e.g., high side devices) and the semiconductor die 12A through 12C can each be relatively low-voltage (LV) devices (e.g., low side devices). In this implementation, the high side devices (semiconductor die 10A through 10C) are on side AA1 of the components 100 of the package and low side devices (semiconductor die 12A through 12C) are on side AA2 of the components 100 of the package.

A portion of the leadframe 110 on side AA1 of the components 100 of the package can be a signal side (or signal terminal) of the leadframe 110. A portion of the leadframe 110 on side AA2 of the components 100 of the package can be a power side (or power terminal) of the leadframe 110. The leadframe 110 can be referred to as an extended leadframe because the leadframe 110 extends from signal side of the leadframe 110, which is coupled to the power side of the leadframe 110, to the power side of the leadframe 110. In this implementation, the high-voltage devices are disposed on (and/or coupled to) the signal side of the leadframe 110 and low-voltage devices are disposed on (and/or coupled to) the power side leadframe 110.

A portion of the leadframe 110 that extends from a molding 140 can be referred to as a lead. The lead 140-AA1 extends from the molding 140 on the AA1 side of the components 100, and the lead 140-AA2 extends from the molding 140 on the AA2 side of the components 100. As shown in FIG. 1A, bondwires can be used for gate connections.

FIG. 1B is a diagram that illustrates a view of a cross-section of FIG. 1A along dashed line A1. In this diagram, a top direction is towards a top of the page and a bottom direction is toward a bottom of the page. A vertical direction extends along the dashed lines A2 and A3 (between the top and bottom), which are through semiconductor die 10A and semiconductor die 12A, respectively. The components 100 of the package include a molding 140 (e.g., molding layer).

As shown in FIG. 1B, the semiconductor die 10A can be disposed between the leadframe 110 and the substrate 120. Accordingly, the semiconductor die 10A is included in a vertical stack that includes (from top to bottom) the leadframe 110, the semiconductor die 10A and the substrate 120. The semiconductor die 10A is disposed between (and coupled to) at least a portion of the leadframe 110 and the substrate 120. Specifically, semiconductor die 10A is disposed between (and coupled to) at least a portion of the leadframe 110 and the metal layer 121 of the substrate 120.

A source (S) and/or a gate (G) of the semiconductor die 10A can be coupled to a bottom surface of the leadframe 110. A drain (D) of the semiconductor die 10A can be coupled to a top surface of the substrate 120. Specifically, the drain (D) of the semiconductor die 10A can be coupled to a top surface of the metal layer 121 of the substrate 120.

In some implementations, the semiconductor die 10A can be flipped (in a different orientation) so that the source and/or gate of the semiconductor die 10A can be coupled to the top surface of the metal layer 121. In such implementations, the semiconductor die 10A can be flipped so that the drain of the semiconductor die 10A can be coupled to the bottom surface of the leadframe 110.

As shown in FIG. 1B, the leadframe 110 can be disposed between the semiconductor die 12A and the substrate 120. The semiconductor die 12A can be disposed between a clip 130 (e.g., a conductive clip) and the leadframe 110. The semiconductor die 12A can be coupled to the clip 130. Accordingly, the semiconductor die 12A is included in a vertical stack that includes (from top to bottom) the clip 130, the semiconductor die 12A, the leadframe 110, and the substrate 120. The semiconductor die 12A is disposed between (and coupled to) the clip 130 and at least a portion of the leadframe 110. The leadframe 110 is disposed between (and coupled to) a bottom surface of the semiconductor die 12A and the metal layer 121 of the substrate 120.

The clip 130 (a first portion of the clip 130) can be coupled to (e.g., directly coupled to) a source (S) and/or a gate (G) of the semiconductor die 12A. The clip 130 (a second portion of the clip 130) can be coupled to a top surface of the metal layer 121 of the substrate 120 via an opening 112 (also can be referred to as a window) within the leadframe 110. Accordingly, the source (S) and/or the gate (G) of the semiconductor die 12A can be electrically coupled to a top surface of the metal layer 121 of the substrate 120 via the clip 130. The clip 130 can be coupled to a die attach pad (DAP) of the leadframe 110 on the power side of the leadframe 110.

A drain (D) of the semiconductor die 12A can be coupled to a top surface of the leadframe 110. Specifically, the drain (D) of the semiconductor die 12A can be coupled to a top surface of the metal layer 121 of the substrate 120. Accordingly, the drain (D) of the semiconductor die 12A can be electrically coupled to a top surface of the metal layer 121 of the substrate 120 via the leadframe 110. In addition, the drain (D) of the semiconductor die 12A can be electrically coupled to the source and/or gate of the semiconductor die 10A via the leadframe 110.

In some implementations, the semiconductor die 12A can be flipped so that the source and/or gate of the semiconductor die 12A can be coupled to the leadframe 110. In such implementations, the semiconductor die 12A can be flipped so that the drain of the semiconductor die 12A can be coupled to the clip 130.

As shown in FIG. 1B, the leadframe 110 can have multiple curved portions 113, 114, and 115 that defined recesses (within the concave portions of the curved portions). These recesses can define one or more cavities between the leadframe 110 and the substrate 120. In this implementation, each of the curved portions 113, 114, and 115 can define concaved shapes (or recesses) with a concave surface (or portion) facing the substrate 120. In some implementations, the curved portions 113, 114, and 115 can be referred to as bent portions or as concave portions. As shown in FIG. 1B, the curved portions 113, 114, 115 can have more than one bend (e.g., more than one inflection point).

In this implementation, the curved portion 113 includes at least a portion of the opening 112. Accordingly, the clip 130 can have at least a portion disposed within the opening 112 within the curved portion 113 of the leadframe 110. In this implementation, the opening 112 is disposed on (e.g., centered on) one side of the curved portion 113. In some implementations, the opening 112 can be centered within the curved portion 113. In this implementation, the opening 112 is curved (e.g., has an inflection point, or is bent) when view from the side. In some implementations, the opening 112 can have a square or rectangular shape or profile when viewed from on top (e.g., when viewed from FIG. 1A).

As shown in FIG. 1B, the semiconductor die 12A is disposed on top of the leadframe 110 between curved portion 113 and curved portion 114. Accordingly, the curved portions 113, 114 (which have concave surfaces facing downward) define between them a concave portion (concave surface facing up) of the leadframe 110 on which the semiconductor die 12A is disposed, and a convex portion (convex surface facing down) that contacts the substrate 120 (e.g., the metal layer 121 of the substrate 120).

The semiconductor die 10A is disposed between curved portion 114 and curved portion 115. Accordingly, the curved portions 114, 115 (which have concave surfaces facing downward) define between them a convex portion (convex surface facing down) of the leadframe 110 to which the semiconductor die 10A is coupled.

A portion of curved portion 113 of the leadframe 110 (on the left side of the curved portion 113) is not in contact with (e.g., is separated by a gap from) the substrate 120 (e.g., the metal layer 121 of the substrate 120). Specifically, a portion of the molding 140 insulates a portion of the curved portion 113 from the substrate 120.

A portion of curved portion 115 of the leadframe 110 (on the right side of the curved portion 115) is not in contact with (e.g., is separated by a gap from) the substrate 120 (e.g., the metal layer 121 of the substrate 120). Specifically, a portion of the molding 140 insulates a portion of the curved portion 115 from the substrate 120.

In some implementations, at least a portion of the substrate 120 (e.g., a bottom portion, a bottom portion of the metal layer 123) can be exposed through the molding 140. In some implementations, the molding 140 can entirely encapsulate the substrate 120 so that a portion of the substrate 120 is not exposed through the molding 140.

As shown in FIG. 1B, in some implementations, at least a portion of the sidewall of the opening 112 can be in contact with the metal layer 121 of the substrate 120. In some implementations, at least a portion of a sidewall of the opening 112 can be disposed above, or insulated from, the metal layer 121 of the substrate 120.

As shown in FIG. 1B, the leadframe 110 is aligned along the plane P1. The leads 110-AA1, 110-AA2 are aligned along the plane P1.

As shown in FIG. 1B, the semiconductor die 12A is aligned along (e.g., parallel to), but disposed above the plane P1. The semiconductor die 10A is aligned along (e.g., parallel to), but disposed below the plane P1. Accordingly, the semiconductor die 12A (on side AA2) is disposed on one side (e.g., a top side) of the leadframe 110 and the semiconductor die 10A (on side AA1) is disposed on an opposite side (e.g., a bottom side) of the leadframe 110.

FIG. 1C is a diagram that illustrates the clip 130, the substrate 120, and semiconductor die 12A-12C. The diagram in FIG. 1C includes a subset of the components shown in FIG. 1A. As shown in FIG. 1C, the metal layer 121 of the substrate 120 can be patterned. Also, as shown in FIG. 1C, the clip 130 can be patterned.

As shown in FIG. 1C, the clip 130 has multiple protrusions 130-1, 130-2 (e.g., contacts, prongs (e.g., two prongs)) coupled to the semiconductor die 12A. In some implementations, the clip 130 can have less or more protrusions.

FIG. 1D is a side view of the clip 130, the substrate 120, and the semiconductor die 12A cut along line A1 shown in FIG. 1C (and in FIG. 1A). As shown in FIG. 1D, the clip 130 has multiple bends. Specifically, the clip 130 defines a concave shape with a concave portion facing toward the substrate 120.

As shown in FIG. 1D, the clip 130 has a first end, or end portion 131 coupled to the semiconductor die 12A. The end portion 131 includes the protrusions 130-1 and 130-2. The clip 130 has a second end, or end portion 132 coupled to substrate 120.

FIG. 1E is a diagram that illustrates a portion of the leadframe 110 and the semiconductor die 12A-12C. The diagram in FIG. 1D includes a subset of the components shown in FIG. 1A.

FIG. 1F is a diagram that illustrates a side cross-sectional view of a portion of the leadframe 110 cut along line A1 shown in FIG. 1E (and FIG. 1A).

As shown in FIG. 1F, a distance N (e.g., a thickness) is between a portion of the leadframe 110 between curved portions 114 and 115, and a bottom of the leadframe 110 (illustrate by the dashed line). The distance N can be approximately equal to a thickness of the semiconductor die 10A (less conductive components (e.g., solder) to couple the semiconductor die 10A to the leadframe 110 and the substrate 120).

Figure 1H:
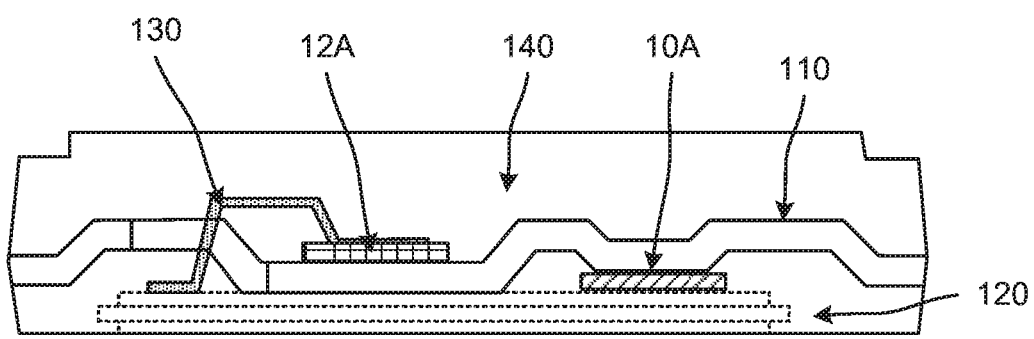

FIG. 1G is a view of a portion of the components 100 of the package shown in FIG. 1A. FIG. 1H is a view of a portion of the components 100 of the package shown in FIG. 1B. FIGS. 1G and 1H generally illustrate the portions of the components 100 encapsulated in the molding 140.

In some implementations, the molding 140 can include, or can be, a molding compound. Accordingly, the molding 140 can include more than one type of material (e.g., a plastic, a resin, an epoxy, a phenolic hardener, a silica material, a pigment, etc.) in the molding material.

The semiconductor die (e.g., semiconductor die 10A through 10C, semiconductor die 12A through 12C, semiconductor die 11) can be, or can include, a variety of devices such as a bipolar junction transistor (BJT), a diode, an insulated gate bipolar transistor (IGBT), a superjunction field effect transistor (FET), a metal oxide semiconductor field effect transistor (MOSFET) device, a silicon carbide (SiC) device (e.g., a SiC BJT), or other transistor device. In some implementations, one or more of the semiconductor die can be, or can include, a circuit such as a filter circuit, a controller circuit, a driver circuit, a communication circuit (e.g., a receiver and/or transmitter), and/or so forth. In some implementations, one or more of the semiconductor die can be, or can include special purpose logic circuitry, combinational logic, a field programmable gate array (FPGA), an application-specific integrated circuit (ASIC), and/or so forth. In some implementations, the package (and/or one or more of the semiconductor die) can be used for many different types of systems such as power management systems, radio frequency (RF) systems, controller systems, computing systems, digital and/or analog systems, etc. One or more of the semiconductor die can include, for example, a high-voltage (HV) (or high side) or low-voltage (LV) (or low side) transistor implemented therein, such as a field-effect transistor (e.g., a vertical FET, a lateral FET). In some implementations, the package can include more than two semiconductor die or less than two semiconductor die.

In the implementation shown in FIGS. 1A through 1H, the substrate 120 can serve as a platform through which connections for a variety of semiconductor devices (e.g., semiconductor die) can be made. Specifically, the electrical connections can be provided via, for example, the metal layer 121 and/or the metal layer 123, which can be coupled to the substrate 120. In some implementations, the substrate 120 (or conductive components coupled thereto (e.g., metal layer 121)) can be soldered onto, for example, portions of the leadframe 110 to establish electrical connection of at least some of the components (e.g., semiconductor die) internal to the package. In some implementations, the metal layer 121 and/or the metal layer 123 can include one or more traces that can be several microns wide and/or thick (e.g., 10 microns, 30, microns, 40 microns) or wider and/or thicker (e.g., greater than 40 microns, 100 microns).

The substrate 120 can include a variety of metal layers (e.g., metal layer 121, metal layer 123) such as one or more conductors (e.g., aluminum conductor (or alloy thereof), copper conductor (or alloy thereof)) and/or one or more dielectrics (e.g., a ceramic material, a pre-molded material, an organic material). In some implementations, the substrate 120 can include one or more layers (e.g., stacked layers) of conductor(s) and/or dielectric(s). For example, in some implementations, the substrate 120 can include a dielectric disposed between a first conductor and a second conductor in a direct bonded copper (DBC). As another example, in some implementations, the substrate 120 can include a single conductor and a single dielectric.

FIG. 2A is a plan (or top) view diagram that illustrates components 200 within a package. The components 200 of the package shown in FIG. 2A are a variation of the components 100 of the package shown in FIGS. 1A through 1G. Accordingly, nearly all of the features of the components 100 of the package are incorporated into the components 200 of the package even if not explicitly labeled or described. The components 200 of the package include several semiconductor die 20A, 20B, 20C, 22A, 22B, and 22C (which can be referred to as die), a leadframe 210, and a substrate 220 (which can be a directed bonded metal substrate (e.g., a directed bonded copper (DBC) substrate)). The leadframe 210 of the components 200 of the package has a signal side on side BB2 and power side on side BB2. The leadframe 210 includes leads 210-BB1, 210-BB2.

In this implementation, the semiconductor die (e.g., semiconductor die 20A-20C and 22A-22C are disposed on the same side of the leadframe 210. Accordingly, a clip is excluded from this implementation and this implementation can be referred to as a clipless implementation.

FIGS. 2B and 2C are diagrams that illustrate views of cross-sections of FIG. 2A along dashed line B1 and B2, respectively. The vertical direction extends along the dashed lines B3 and B4, which are through semiconductor die 22A and semiconductor 20C, respectively. The components 200 of the package include a molding 240. In these diagrams, a top direction is towards a top of the page and a bottom direction is toward a bottom of the page.

As shown in FIG. 2B, the semiconductor die 22A can be disposed between the leadframe 210 and the substrate 220. Accordingly, the semiconductor die 22A is included in a vertical stack that includes (from top to bottom) the leadframe 210, the semiconductor die 22A and the substrate 220.

A source (S) and/or a gate (G) of the semiconductor die 22A can be coupled to a bottom surface of the leadframe 210. A drain (D) of the semiconductor die 22A can be coupled to a top surface of the substrate 220. Specifically, the drain (D) of the semiconductor die 22A can be coupled to a top surface of the metal layer 221 of the substrate 220.

As shown in FIG. 2C, the semiconductor die 20C can be disposed between the leadframe 210 and the substrate 220. Accordingly, the semiconductor die 20C is included in a vertical stack that includes (from top to bottom) the leadframe 210, the semiconductor die 20C and the substrate 220.

A source (S) and/or a gate (G) of the semiconductor die 20C can be coupled to a bottom surface of the leadframe 210. A drain (D) of the semiconductor die 20C can be coupled to a top surface of the substrate 220. Specifically, the drain (D) of the semiconductor die 22A can be coupled to a top surface of the metal layer 221 of the substrate 220.

As shown in FIGS. 2B and 2C, the leadframe 210 is aligned along a plane P2, and the leads 210-BB1, 210-BB2 are aligned along the plane P2. The semiconductor die 22A and 20C are aligned along (e.g., parallel to), but disposed below the plane P2. Accordingly, both of the semiconductor die 20C and 22A (which are on side BB1 and BB2, respectively) are disposed on one side (e.g., a bottom side) of the leadframe 210.

Portions of the leadframe 210 that are coupled to each of the semiconductor die 20A-20C and/or 22A-22C, in this embodiment, have a shape with at least one protrusion (e.g., multiple protrusions (e.g., a fork shape)). For example, portion 214 coupled to semiconductor die 22C has a shape with multiple protrusions. In some implementations, one or more of the portions of the leadframe 210 that are coupled to each of the semiconductor die can have a different shape. As shown the protrusions (which can function as contact points) can have different lengths. At least some of the portions of the leadframe 210 that are coupled to at least some of the semiconductor die 20A-20C are parallel strips.

As shown in FIG. 2A, the leadframe 210 includes a portion 213 that can be removed (e.g., cut, severed) after the molding 240 has been included in the components 200 of the package. The portion 213 can be disposed outside of (e.g., exposed outside of) the molding 240 after the molding has been included in the components 200 of the package. Accordingly, the portion 214 of the leadframe 210 can be decoupled from the remaining portions of the leadframe 210 (e.g., decoupled from the power side of the leadframe 210). In some implementations, the portion 214 of the leadframe 210 can be electrically isolated from (e.g., insulated from) the remaining portions of the leadframe 210. In some implementations, the portion 213 of the leadframe 210 can be removed before the molding 240 has been included in the components 200 of the package.

The portion 214, after being separated from the remaining portions of the leadframe 210, can function has a clip (e.g., a one-body clip) from the semiconductor die 22C to the substrate 220. Accordingly, the portion 214 can be an extended leadframe clip. Portions similar to portion 213 and portion 214 can be included in the leadframe 210.

In some implementations, any of the semiconductor die 20A through 20C and/or semiconductor die 22A through 22C can be flipped so that the source and/or gate of the semiconductor die can be coupled to the top surface of the metal layer 221. In such implementations, the semiconductor die can be flipped so that the drain of the semiconductor die can be coupled to the bottom surface of the leadframe 210.

As shown in FIG. 2B, the leadframe 210 has a curved portion 216 with a concave surface facing toward the substrate 220. A first end of the curved portion 216 is coupled to the semiconductor die 22A and a second end of the curved portion 216 is coupled to the substrate 220 (e.g., the metal layer 221 of the substrate 220).

As shown in FIG. 2C, the semiconductor die 10A is disposed between curved portion 217 and curved portion 218. Accordingly, the curved portions 217, 218 define a convex portion (convex surface facing down) of the leadframe 110 to which the semiconductor die 20A is coupled.

Figure 2D:
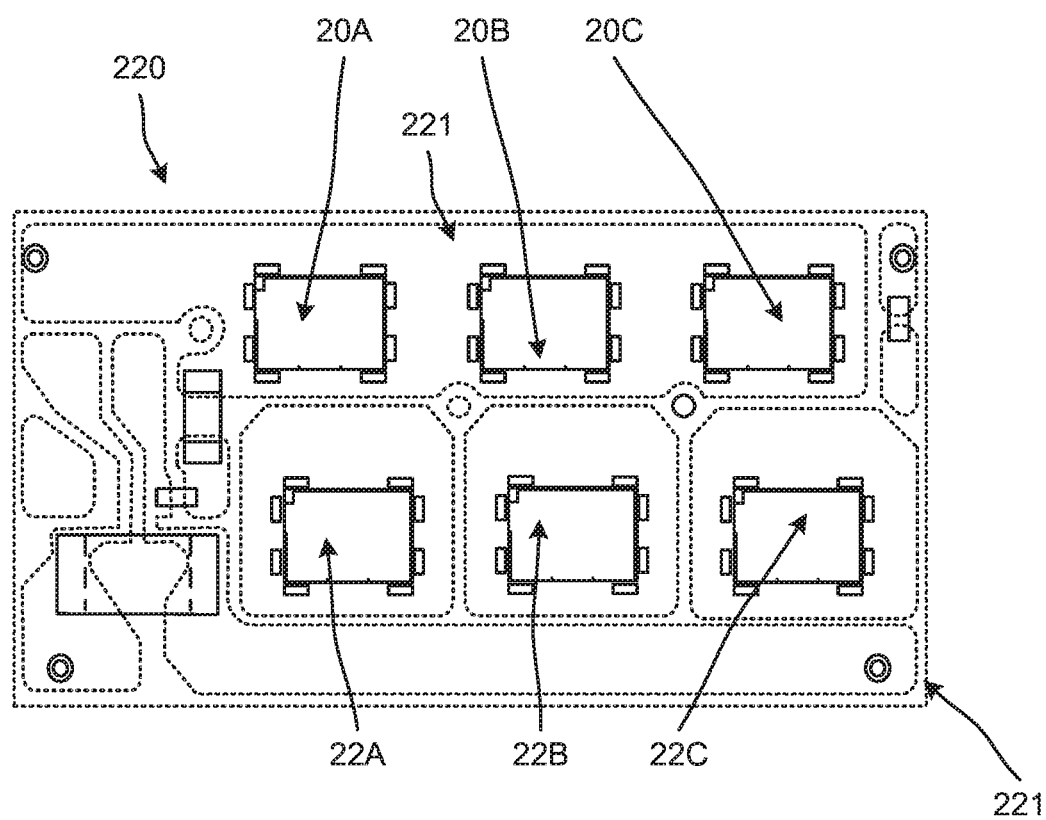

FIG. 2D is a diagram that illustrates a top view of the substrate 220 shown in FIG. 2A. The diagram in FIG. 2D includes a subset of the components 200 shown in FIG. 2A. As shown in FIG. 2D, the metal layer 221 of the substrate 220 can be patterned.

Figure 2E:
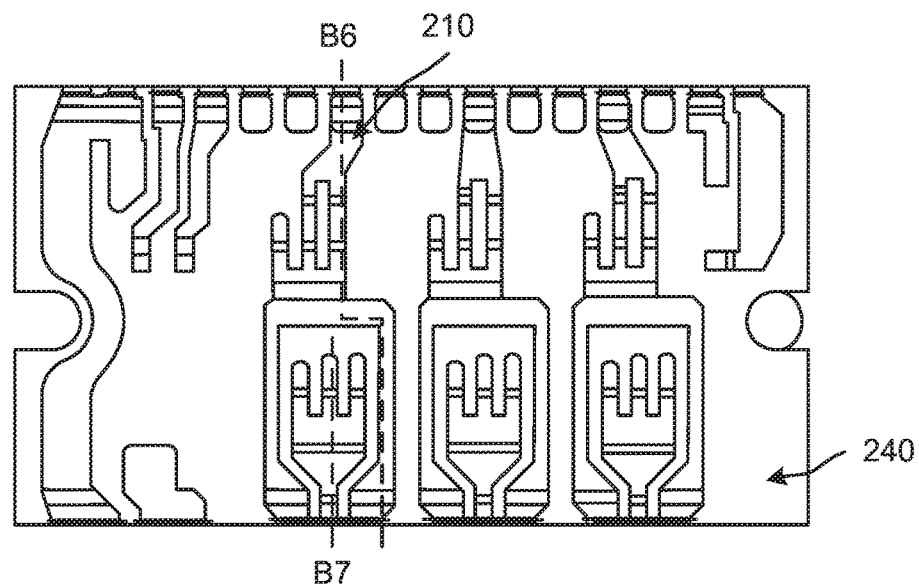
Figure 2F:
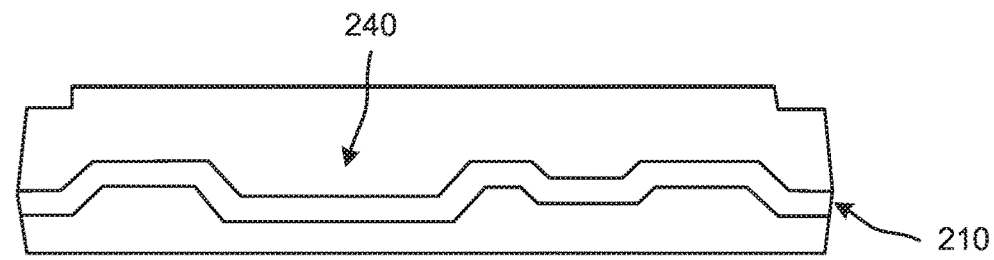
Figure 2G:
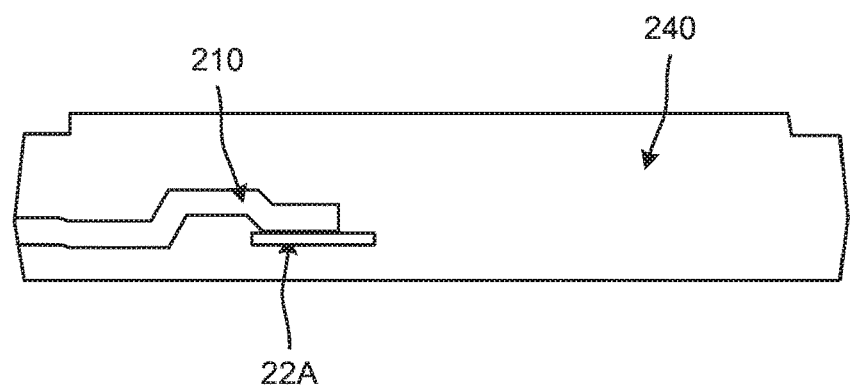

FIG. 2E is a diagram that illustrates a portion of the leadframe 210 shown in FIG. 2A. FIGS. 2F and 2G are diagrams that illustrate side cross-sectional views of the leadframe 210 that correspond with FIGS. 2B and 2C. These diagrams include a subset of the components 200 shown in FIG. 2A. The portion of the leadframe 210 shown in FIG. 2F (shown in FIG. 2E) is cut along line B6 and the portion of the leadframe 210 shown in FIG. 2G is cut along line B7 (shown in FIG. 2E).

Figure 2H:
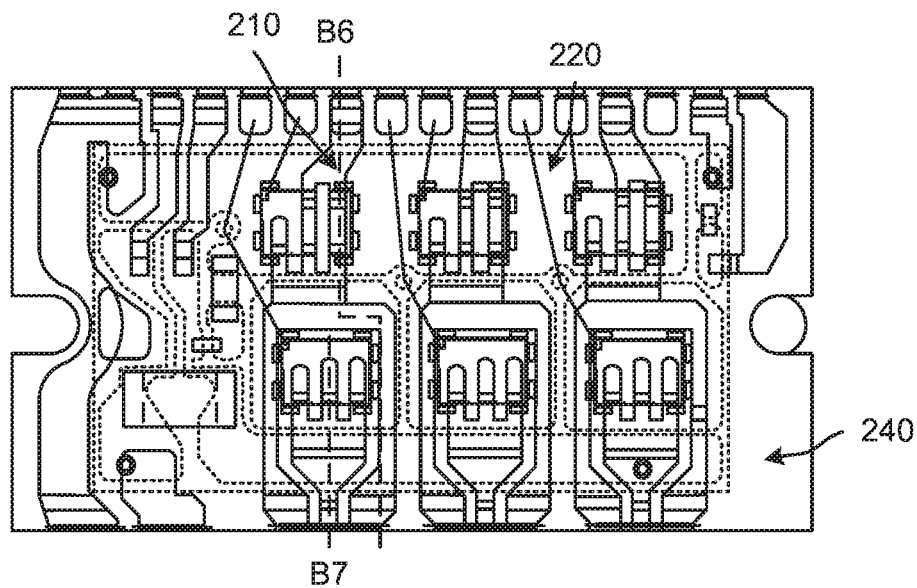
Figure 2I:
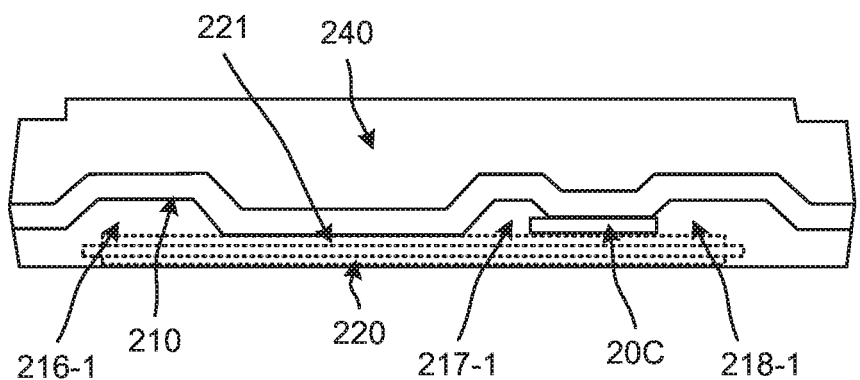
Figure 2J:
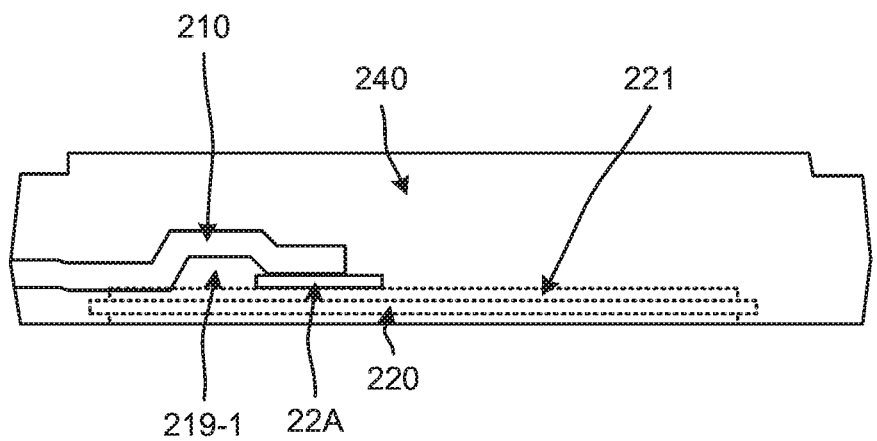

FIG. 2H is a diagram that illustrates a portion of the components 200 of the package 200 shown in FIG. 2A. FIGS. 2I and 2J are diagrams that illustrate side cross-sectional views of the components 200 of the package that correspond with FIGS. 2B and 2C. These diagrams include a subset of the components 200 shown in FIG. 2A. The portion of the leadframe 210 shown in FIG. 2I (shown in FIG. 2H) is cut along line B6 and the portion of the leadframe 210 shown in FIG. 2J is cut along line B7 (shown in FIG. 2H).

As shown in FIG. 2H, the leadframe 210 can have multiple recesses 216-1, 217-1, 218-1, and 219-1. These recesses can define one or more cavities between the leadframe 210 and the substrate 220.

A portion of the leadframe 210 is not in contact with (e.g., is separated by a gap from) the substrate 220 (e.g., the metal layer 221 of the substrate 220) because of the recess 216-1. Specifically, a portion of the molding 240 insulates a portion of the leadframe 210 associated with recess 216-1 from the substrate 220.

A portion of the leadframe 210 is not in contact with (e.g., is separated by a gap from) the substrate 220 (e.g., the metal layer 221 of the substrate 220) because of the recess 218-1.

Specifically, a portion of the molding 240 insulates a portion of the leadframe 210 associated with recess 218-1 from the substrate 220.

As shown in FIGS. 2I and 2J, the profile (e.g., shape) of the recess 216-1 is different from the profile (e.g., shape) of the recess 219-1. The leadframe 210 is contacted on both sides of recess 219-1 to the substrate 220, and is not contacted on both sides of the recess 216-1 to the substrate 220. The recess 216-1 is lateral to (e.g., to the left) of the recess 219-1 (from the perspective of the plan view of FIG. 2H)

FIGS. 3A through 3C illustrate various view of components 300 of a package 301. In this implementation, the components 300 of the package 301 include wirebonds 350 between portions of the leadframe 310 and the semiconductor die 30. FIGS. 3D and 3E illustrate various view of the package 301 in a final module form.

Figure 4B:
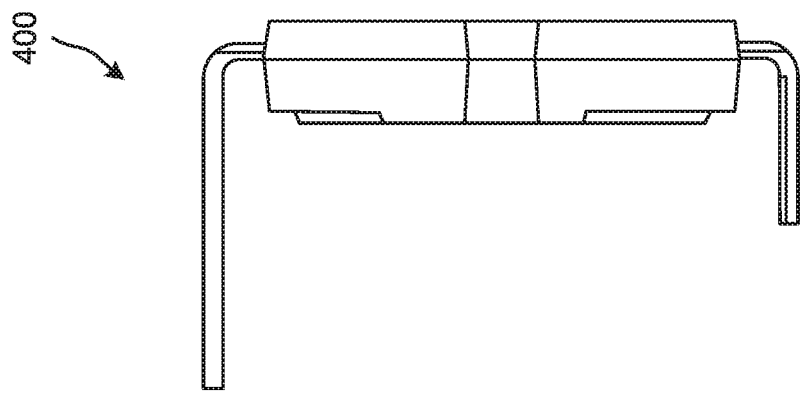
FIGS. 4A and 4B illustrate various view of a package of the components of the package shown in FIGS. 1A through 1E.
Figure 4A:
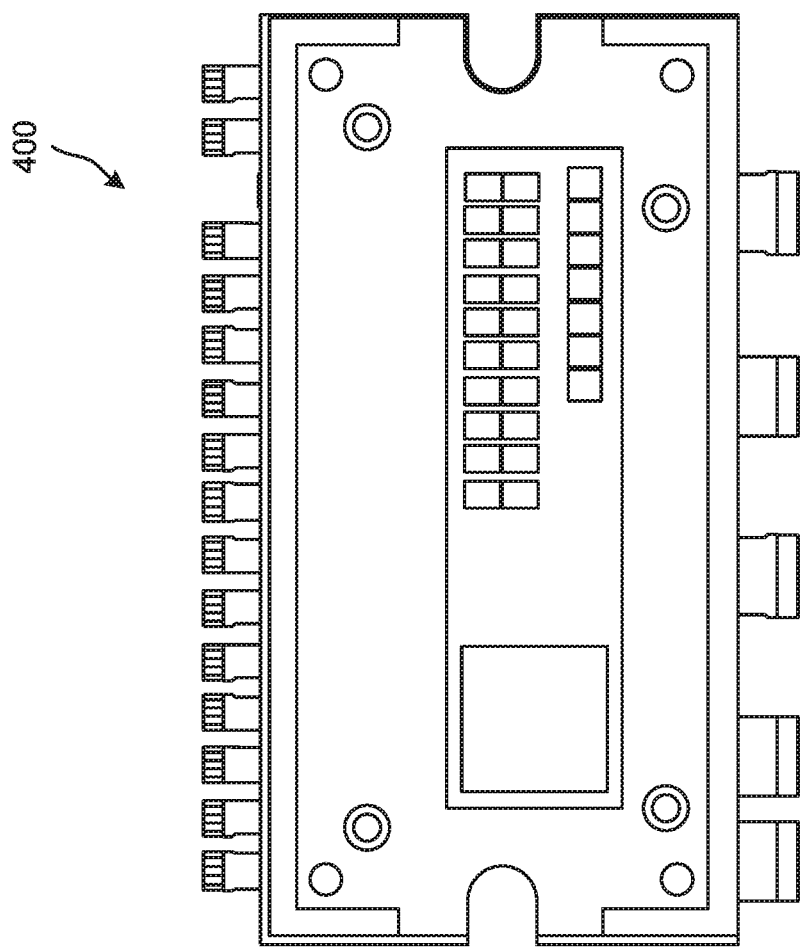

FIGS. 4A and 4B illustrate various view of a package 400 of the components 100 of the package shown in FIGS. 1A through 1E in a final module form.

Figure 5C:
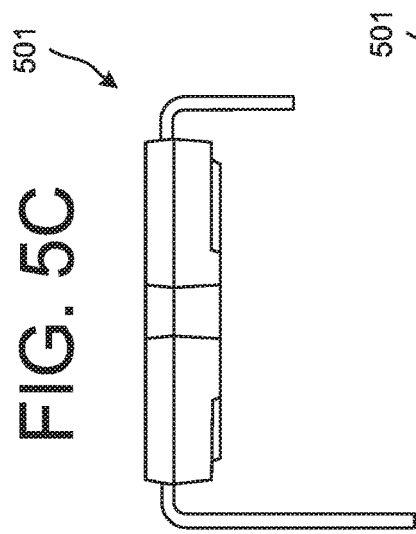
FIGS. 5C and 5D illustrate the components of the package referenced in FIGS. 5A and 5B.
Figure 5D:
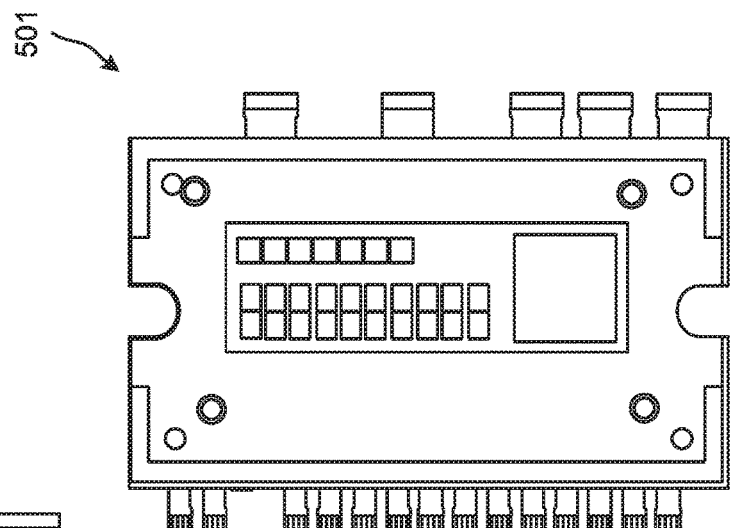
Figure 5B:
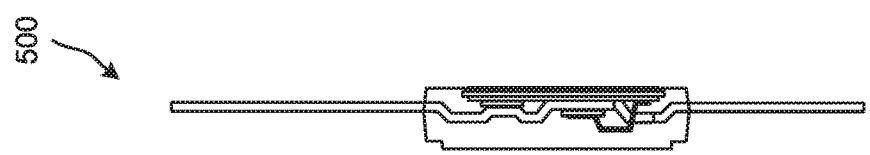
FIGS. 5A and 5B illustrate various view of components of a package that is a variation of the components of the package shown in FIGS. 1A through 1E.
Figure 5A:
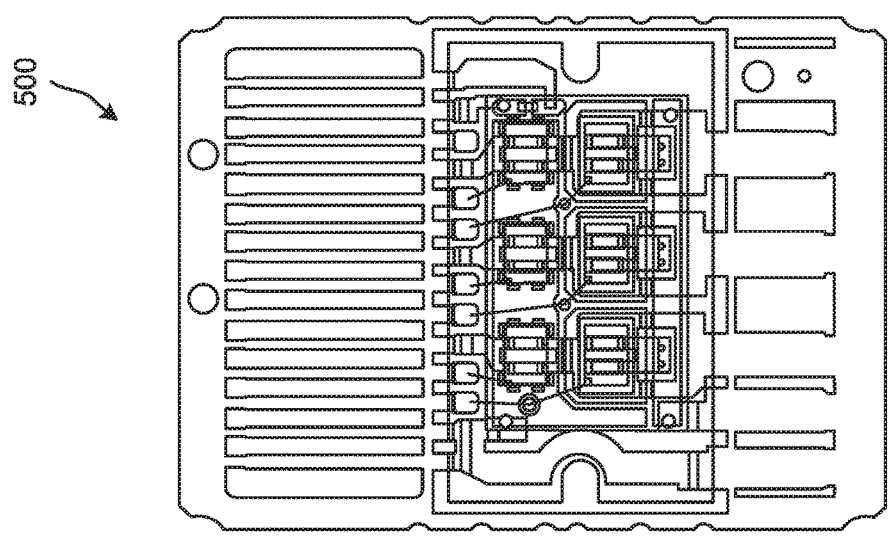

FIGS. 5A and 5B illustrate various view of components 500 of a package 501 that is a variation of the components 100 of the package shown in FIGS. 1A through 1E. FIGS. 5C and 5D illustrate the components 500 of the package 501 in a final module form. Unlike the embodiments shown in some of the figures, the package 500 includes six MOSFET semiconductor die and excludes other semiconductor die (e.g., semiconductor die 11 shown in FIG. 1A).

FIGS. 6A and 6B illustrate various view of a package 600 of the components 200 of the package shown in FIGS. 2A through 2J in a final module form. As shown in FIG. 6A, the portion 213 has been removed so that there is a gap between the portion 214 and the leadframe 210. A side cross-sectional view of the portion of the leadframe 210 (e.g., extended leadframe clip) that remains within the molding 240 after the portion 213 is removed is shown in FIG. 2J.

FIG. 7 is a method that illustrates a method of making a package including a semiconductor die. As shown in FIG. 7, the method includes coupling a semiconductor die to a substrate (e.g., a DBC) at block S710. A leadframe is coupled to the semiconductor die as block S720. At least a portion of the leadframe, the semiconductor die, and the substrate are encapsulated in a molding at block S730. A clip is formed within the molding by removing a portion (e.g., portion 213 shown in FIG. 2A) of the leadframe disposed outside of the molding at block S740. In some implementations, the clip can be referred to as an extended leadframe clip because the clip is formed from the leadframe. The portion of the leadframe is removed so that there is a gap between a portion of the leadframe coupled between the semiconductor die and the substrate, and a remaining portion of the leadframe. As noted above, FIG. 2J illustrates a side cross-sectional view of the portion of the leadframe 210 (e.g., extended leadframe clip) that remains within the molding 240 after the portion 213 is removed.

As shown in FIGS. 3D, 3E, 4A, 4B, 5C, 5D, 6A, and 6B, the leads of the leadframes are bent relative to the portions of the leadframes disposed within the molding layers. In some implementations, one or more of the leads are aligned orthogonal (e.g., substantially orthogonal) to portions of the leadframes disposed within the molding.

In one general aspect, an apparatus can include a semiconductor die, a substrate, and a leadframe coupled to the substrate. The apparatus can include a conductive clip coupled to the semiconductor die. The leadframe can be disposed between the semiconductor die and the substrate, and the semiconductor die an be disposed between the conductive clip and the leadframe.

In some implementations, the apparatus can include a molding layer encapsulating the semiconductor die. In some implementations, the apparatus can include a molding layer encapsulating the semiconductor die, and the leadframe can have a lead portion extending from the molding layer.

In some implementations, the apparatus includes a vertical stack from top to bottom including the conductive clip, the semiconductor die, the leadframe, and the substrate. In some implementations, the semiconductor die is a first semiconductor die. The apparatus can also include a second semiconductor die, and the second semiconductor die can be disposed between the leadframe and the substrate. In some implementations, the semiconductor die is a first semiconductor die coupled to a top side of the leadframe. The apparatus can include a second semiconductor die coupled to a bottom side of the leadframe.

In some implementations, the conductive clip has a first end portion coupled to the semiconductor die, and the conductive clip has a second end portion coupled to the substrate. In some implementations, the leadframe includes an opening, and the conductive clip has a portion disposed in the opening. In some implementations, the leadframe includes an opening, the conductive clip has a first end portion coupled to the semiconductor die, and the conductive clip has a second end portion coupled to the substrate via the opening.

In some implementations, the substrate includes a dielectric layer disposed between a first metal layer and a second metal layer. In some implementations, the first metal layer is a copper metal layer.

In one general aspect, an apparatus can include a leadframe, a first semiconductor die coupled to a top side of the leadframe, and a second semiconductor die coupled to a bottom side of the leadframe. The apparatus can include a substrate coupled to the bottom side of the leadframe, and a conductive clip coupled to a top side of the first semiconductor die.

In some implementations, the first semiconductor die is disposed between the leadframe and the substrate. In some implementations, the conductive clip is coupled to a gate and a source of the first semiconductor die. The first semiconductor die has a drain coupled to the leadframe, and a drain coupled to the substrate. In some implementations, the second semiconductor die has a gate and a source coupled to the bottom side of the leadframe, and a drain coupled to a top side of the substrate. In some implementations, the first semiconductor die includes a low voltage device, and the second semiconductor die has a drain coupled to the top side of the leadframe.

In another general aspect, an apparatus includes a first semiconductor die, a second semiconductor die, and a substrate. The apparatus can include a leadframe coupled to the substrate, and a conductive clip coupled to the first semiconductor die. The leadframe can be disposed between the first semiconductor die and the substrate, and the second semiconductor die can be disposed between the leadframe and the substrate.

In some implementations, the apparatus includes a first vertical stack from top to bottom including the conductive clip, the first semiconductor die, a first portion of the leadframe, and the substrate. The apparatus includes a second vertical stack from top to bottom including a second portion of the leadframe, the second semiconductor die, and the substrate.

In some implementations, the first semiconductor die coupled to a top side of the leadframe, and the second semiconductor die is coupled to a bottom side of the leadframe. In some implementations, the substrate includes a dielectric layer disposed between a first metal layer and a second metal layer.

It will also be understood that when an element, such as a transistor or resistor, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Implementations may be implemented in a computing system that includes an industrial motor driver, a solar inverter, ballast, a general-purpose half-bridge topology, an auxiliary and/or traction motor inverter driver, a switching mode power supply, an on-board charger, an uninterruptible power supply (UPS), a back-end component, e.g., as a data server, or that includes a middleware component, e.g., an application server, or that includes a front-end component, e.g., a client computer having a graphical user interface or a Web browser through which a user can interact with an implementation, or any combination of such back-end, middleware, or front-end components. Components may be interconnected by any form or medium of digital data communication, e.g., a communication network. Examples of communication networks include a local area network (LAN) and a wide area network (WAN), e.g., the Internet.

Some implementations may be implemented using various semiconductor processing and/or packaging techniques. Some implementations may be implemented using various types of semiconductor processing techniques associated with semiconductor substrates including, but not limited to, for example, Silicon (Si), Galium Arsenide (GaAs), Galium Nitride (GaN), and/or so forth.

While certain features of the described implementations have been illustrated as described herein, many modifications, substitutions, changes and equivalents will now occur to those skilled in the art. It is, therefore, to be understood that appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. An apparatus, comprising:
    a semiconductor die;
    a substrate, the semiconductor die having a bottom surface coupled to the substrate;
    a leadframe coupled to the substrate and defining an opening; and
    a one-body clip having a first portion disposed within the opening and coupled to a top surface of the semiconductor die, the one-body clip having a second portion disposed within the same opening and coupled to the substrate.

2. The apparatus of claim 1, wherein the leadframe defines at least a portion of a power terminal.

3. The apparatus of claim 2, wherein the semiconductor die is located within the opening of the leadframe and separated from the leadframe defining the at least the portion of the power terminal.

4. The apparatus of claim 1, wherein the opening of the leadframe surrounds at least a portion of the first portion of the one-body clip.

5. The apparatus of claim 1, wherein the semiconductor die has an outer profile smaller than and disposed within a shape of the opening of the leadframe.

6. The apparatus of claim 1, wherein a portion of the leadframe is cut from the leadframe to define the one-body clip.

7. The apparatus of claim 1, wherein the one-body clip has a recess disposed between the first portion and the second portion.

8. The apparatus of claim 1, wherein the leadframe defines a recess, the leadframe is not contacted on both sides of the recess to the substrate.

9. The apparatus of claim 1, wherein the one-body clip defines a recess having a profile different from a profile of a recess defined by the leadframe.

10. The apparatus of claim 1, wherein the substrate includes a dielectric layer disposed between a first metal layer and a second metal layer, the leadframe being coupled to the first metal layer.

11. The apparatus of claim 1, wherein the semiconductor die is a first semiconductor die,
    the apparatus further comprising a second semiconductor die, the second semiconductor die being disposed between a portion of the leadframe and the substrate, the first portion of the one-body clip is aligned within a same plane as the portion of the leadframe.

12. The apparatus of claim 1, further comprising:
    a molding layer encapsulating the semiconductor die.

13. The apparatus of claim 1, wherein the opening has a least four sides around the one-body clip.

14. An apparatus, comprising:
a first semiconductor die;
a second semiconductor die;
a substrate, the first semiconductor die having a bottom surface coupled to the substrate;
a leadframe having a portion coupled to the substrate and to the second semiconductor die; and
a one-body clip coupled to a top surface of the first semiconductor die and a top surface of the substrate through an opening in the leadframe such that a first portion of the one-body clip coupled to the first semiconductor die is disposed in a first portion of the opening and a second portion of the one-body clip coupled to the substrate is disposed in a second portion of the opening.

15. The apparatus of claim 14, wherein the leadframe defines at least a portion of a power terminal.

16. The apparatus of claim 14, wherein the first and second portions of the one-body clip are insulated from the leadframe and separated from the leadframe by the opening.

17. The apparatus of claim 14, wherein the first semiconductor die coupled to a bottom side of the first portion of the one-body clip, the second semiconductor die is coupled to a bottom side of the portion of the leadframe.

18. The apparatus of claim 14, wherein the substrate includes a dielectric layer disposed between a first metal layer and a second metal layer.

19. The apparatus of claim 14, wherein the substrate includes a dielectric layer encapsulated within a molding layer.

20. An apparatus, comprising:
a semiconductor die;
a substrate, the semiconductor die having a bottom surface coupled to the substrate;
a leadframe coupled to the substrate, the leadframe including an opening; and
a one-body clip having a first portion, a second portion, and a recess disposed between the first portion and the second portion,
the first portion of the one-body clip being disposed within the opening and coupled to top surface of the semiconductor die, the one-body clip having the second portion disposed within the opening and coupled to the substrate.

21. The apparatus of claim 20, wherein the leadframe defines a recess, the recess of the one-body clip has a profile different from a profile of the recess defined by the leadframe.

* * * * *